(12) United States Patent
Kim

(10) Patent No.: US 6,271,736 B1
(45) Date of Patent: Aug. 7, 2001

(54) DIGITAL TEMPERATURE-COMPENSATING CRYSTAL OSCILLATOR, AND METHOD FOR STABILIZING FREQUENCY THEREOF

(75) Inventor: Seok-Yong Kim, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/472,322

(22) Filed: Dec. 23, 1999

(30) Foreign Application Priority Data

Mar. 22, 1999 (KR) .................................................... 99-9660
Dec. 3, 1999 (LR) .................................................... 99-54660

(51) Int. Cl.[7] .............................. H03L 1/02; H03B 5/04; H03B 5/36
(52) U.S. Cl. .................................. 331/176; 331/116 FE; 331/158
(58) Field of Search .......................... 331/116 R, 116 FE, 331/158, 176

(56) References Cited

U.S. PATENT DOCUMENTS 5,170,136 * 12/1992 Yamakawa et al. .................. 331/176
5,473,289 * 12/1995 Ishizaki et al. ....................... 331/176

FOREIGN PATENT DOCUMENTS 61-114605 * 6/1986 (JP).
08191215   7/1996 (JP).

* cited by examiner

Primary Examiner—Siegfried H. Grimm
(74) Attorney, Agent, or Firm—Renner, Otto, Boisselle & Sklar LLP

(57) ABSTRACT

A digital temperature compensating crystal oscillator, and a method for stabilizing the frequency thereof, in which not only the vibration phenomenon caused during the conversion of analog signals to digital signals in spite of a constant ambient temperature is decreased, but also the output frequency vibrations caused by the noises of analog devices are also decreased, thereby improving the stability and the reliability. If an output temperature data of an analog/digital converter is a first sampling data, then the output temperature data of the analog/digital converter is used directly as a temperature code for obtaining a temperature compensating data, to be stored into a memory. If it is not a first sampling data, then the output temperature data of the analog/digital converter are accumulated up to a predetermined number of times, and an average of accumulated values is supplied into the memory as a temperature code for obtaining the temperature compensating data.

11 Claims, 12 Drawing Sheets

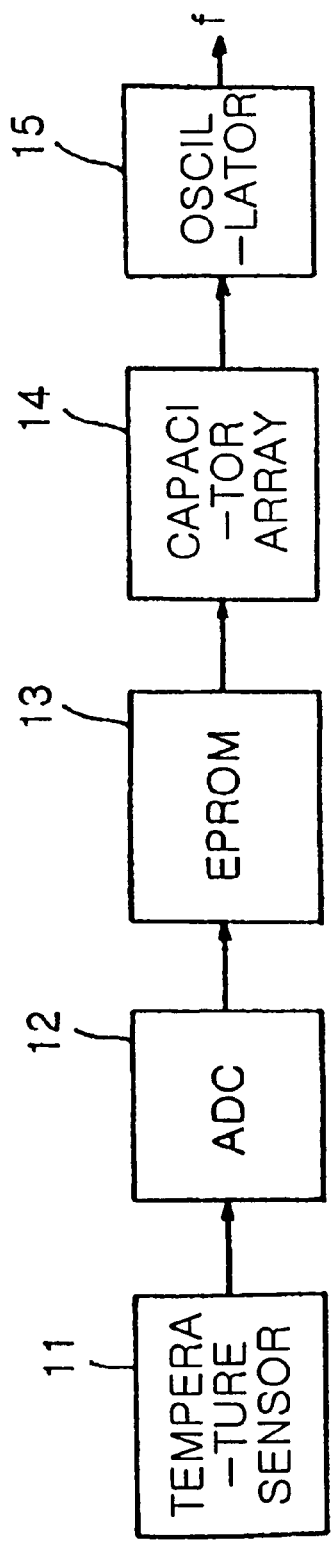

DIGITAL TEMPERATURE-COMPENSATING CRYSTAL OSCILLATOR, AND METHOD FOR STABILIZING FREQUENCY THEREOF

BACKGROUND OF THE INVENTION

1. Field of the Invention

The present invention relates to a digital temperature compensating crystal oscillator. More specifically, the present invention relates to a digital temperature compensating crystal oscillator, and a method for stabilizing the frequency thereof, in which not only the vibration phenomenon caused by the conversion of analog signals to digital signals in spite of a constant abient temperature is decreased, but also the output frequency vibrations caused by the noises of analog devices are also decreased, thereby improving the stability and the reliability.

2. Description of the Prior Art

Generally, the temperature compensating crystal oscillator is constituted such that the highly stable quartz oscillator is provided with a temperature compensating means, so that the variations of the frequency due to the abient temperature can be compensated. This crystal oscillator was embodied in the analog form at first.

However, this analog type temperature compensating crystal oscillator showed a limit to meeting the miniaturization-light weight trend. At present, therefore, there is provided a digital method consisting of a couple of individual devices such as an integrated circuit and a crystal oscillator. An example of this digital temperature compensating crystal oscillator is illustrated in FIG. 1.

As shown in FIG. 1, the digital temperature compensating oscillator includes: a temperature sensing section 11 for sensing the abient temperature to output voltage signals; an analog/digital converting section 12 for converting the temperature voltages of the temperature sensing section 11 to digital data; a memory section 13 for storing oscillation compensating data for different temperatures, and for outputting oscillation compensating data, with the output data of the analog/digital converting section 12 serving as the address; a capacitor array section 14 with a plurality of capacitors connected through switching devices respectively, and with the capacitors circuitally connected in accordance with the output oscillation compensating data of the memory section 13 so as to form the required capacitance; and an oscillating section 15 including crystal oscillating elements to form a crystal oscillating circuit so as to a frequency fo, the crystal oscillating elements being connected to the capacitor array section 14.

As shown in FIG. 8a, the temperature sensing section 11 includes: a start-up circuit 311 for activating the following circuits upon supplying a power; a constant current generating section 312 for being activated by the activating circuit 311 to generate a constant current; a temperature sensing circuit 313 with its current being always constant owing to the constant current generating section 312, and with its voltage being varied by the ambient temperature; and an output amplifying circuit 314 for amplifying the voltage V1 of the temperature sensing circuit 313 to a certain level.

Here, the output temperature sensing signals of the temperature sensing section 11 are voltage signals of a certain range (e.g., 0–3 V).

As shown in FIG. 8b, the analog/digital converting section 12 includes: a reference voltage generating section 321 for outputting $2^n$ reference voltages (where n is the number of the bits of the converted digital data) after distinguishing the ranges of the output voltages of the temperature sensing section 11; a switching section 322 consisting of a plurality of switch circuits with their one ends being connected to a respective output terminal of the reference voltage generating section 321, and with their other ends being commonly connected together, for selecting one of the output voltages; a comparing section 323 for outputting a difference between the output voltage of the switching section 322 and the output voltage $B_{temp}$ of the temperature sensing section 11; and an SAR section 324 for carrying out a switching to supply the reference voltages sequentially to the comparing section 323 upon supplying the power, so as to output the relevant digital data in the form of a converted data $D_{ADC}$ when the output value of the comparing section 323 becomes 0.

The memory section 13 may consist of an EPROM.

As shown in FIG. 8c, the capacitor array section 14 includes a plurality of capacitors $C_{11}$–$C_{1m}$ connected in parallel. The respective capacitors are grounded through switching devices Q1–Qm which are operated by the output data D0–DM of the memory section 13.

As shown in FIG. 8d, the oscillating section 15 includes: a crystal element X-ta1, a plurality of capacitor devices and an MOS transistor. Here, the common contact points A of the capacitor array section as shown in FIG. 8c are connected respectively to, both terminal P1 and P2 of the crystal oscillating element X-tal of the oscillating section 15.

Here, as another embodiment, the digital temperature compensating oscillator includes a digital/analog converter and a varactor diode instead of the capacitor array 14. The memory section 13 is stored with control voltages which carry out controls in relation with the ambient temperature, the control voltages being supplied to the varactor diode. Thus the voltage which is supplied to the varactor diode is varied in accordance with the sensing temperature of the temperature sensor, so that the oscillation frequency can be controlled.

At any case, however, the temperature sensing section and the analog/digital converter are necessarily provided. These two devices have the analog characteristics, and therefore, there is generated an error of ±2 LSB in the output data of the analog/digital converter due to the undesired noise from the designing stage.

Further, when the temperature voltages $V_{temp}$ which are analog signals are converted into digital signals, the temperature voltages $V_{temp}$ which are analog signals corresponding to the ambient temperatures are sampled at certain units to convert them into digital data $D_{ADC}$ as shown in FIG. 2a. Therefore, as shown in FIG. 2b, a boundary voltage Va exists which corresponds to both of the two temperature data $C_{n-1}$ and $C_n$. At this boundary temperature voltage, two digital data can be produced. Accordingly, if the output voltage of the temperature sensing section 11 is the boundary voltage Va during the digital conversion, a digital data $D_{n-1}$ or a digital data $D_n$ can be outputted from the analog/digital converting section 12. Therefore, the output oscillation frequency of the oscillating section 15 can be either f1 or f2.

Therefore, when the digital temperature compensating oscillator converts the analog temperature voltages to digital data, if the ambient temperature lies at the boundary of the resolution of the analog/digital converter, the sampled temperature data can be continuously varied, and therefore, the output frequency is seriously influenced.

In order to solve the problem of the boundary value, Motorola Pendulum-LV and Chronos-LV User's Guide proposes the use of an anti-dither circuit. In this vibration eliminating circuit, only if the temperature data which have been continuously obtained by a certain number of times through the analog/digital converter are all different from the previously stored temperature data, then a new temperature data is outputted. In this method, therefore, only if the temperature sampled data which have been continuously obtained more than a certain number of times are different from the previous temperature, then the frequency compensation with respect to the temperature variation is realized.

However, in this oscillator of the Motorola company in which the above described method is applied, there is adopted a temperature compensating code of 4 bits. Therefore, no influence is received from the variations of the adjacent temperature codes during the sampling. However, if the data hits are increased to more than 10 bits to improve the precision in accordance with the request of users, then the variations of the temperature codes due to the self characteristics of the analog temperature sensing section and the analog/digital converting section cannot be prevented.

Particularly, no matter how perfectly an analog/digital converter may be designed, basically there is an error of ±1. Further, the inherent error of the temperature sensor cannot be ignored, and even if the above described conventional method is applied, the vibrations of the output frequency at a constant temperature cannot be avoided.

SUMMARY OF THE INVENTION

The present invention is intended to overcome the above described disadvantages of the conventional techniques.

Therefore it is object of the present invention to provide a digital temperature compensating oscillator, and a method for stabilizing the frequency thereof, in which not only the vibration phenomenon caused during the conversion of analog signals to digital signals in spite of a constant abient temperature is decreased, but also the output frequency vibrations caused by the noises of analog devices, are also decreased, thereby improving the stability and the reliability.

In achieving the above object, the method of stabilizing a frequency by using a digital temperature compensating oscillator including a temperature sensing means, an analog/digital converting means, a memory means and an oscillating means according to the present invention is characterized in that: a checking is made as to whether an output temperature data of the analog/digital converting means is a first sampling data; if it is a first sampling data, then the output temperature data of the analog/digital converting means is set-up (as it is) as a temperature code for obtaining a temperature compensating data, so as to store it into the memory means; and if it is not a first sampling data, then the output temperature data of the analog/digital converting means are accumulated up to a number of times, and an average of the accumulated values is supplied into the memory means as a temperature code for obtaining the temperature compensating data.

In another aspect of the present invention, the digital temperature compensating oscillator according to the present invention includes: an oscillating section for being oscillated at a pre-set frequency; a frequency adjusting section for variably adjusting the frequency of the oscillating section; a memory section for storing control data (for different temperatures) of the frequency adjusting section to compensate frequency variations of the oscillating section in accordance with the variations of the ambient temperature, and for outputting a relevant control data to the frequency adjusting section during an inputting of a temperature data; an analog/digital converting section for converting output analog signals of the temperature sensing section to digital data; and a frequency stabilizing section for comparing digital data of the analog/digital converting section with a preset temperature variation range, to output an average value of accumulated digital data (by a certain number of times) of a normal temperature variation range, or to output a digital data other than the normal temperature variation range, to the memory section as a temperature code.

BRIEF DESCRIPTION OF THE DRAWINGS

The above object and other advantages of the present invention will become more apparent by describing in detail the preferred embodiment of the present invention with reference to the attached drawings in which:

FIG. 1 illustrates the constitution of the general digital temperature compensating oscillator;

DETAILED DESCRIPTION OF THE PREFERRED EMBODIMENT

Figure 2A:
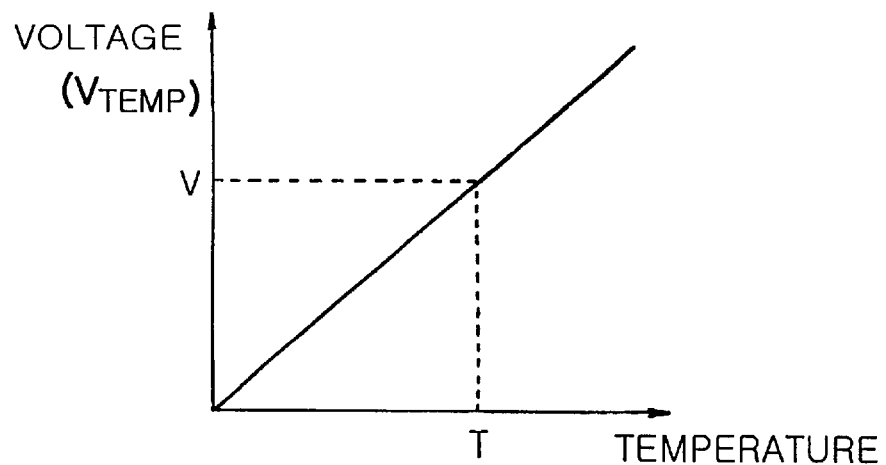
FIGS. 2a and 2b are graphical illustration showing the cause of the frequency vibrations at the conventional digital temperature compensating oscillator.
Figure 2B:
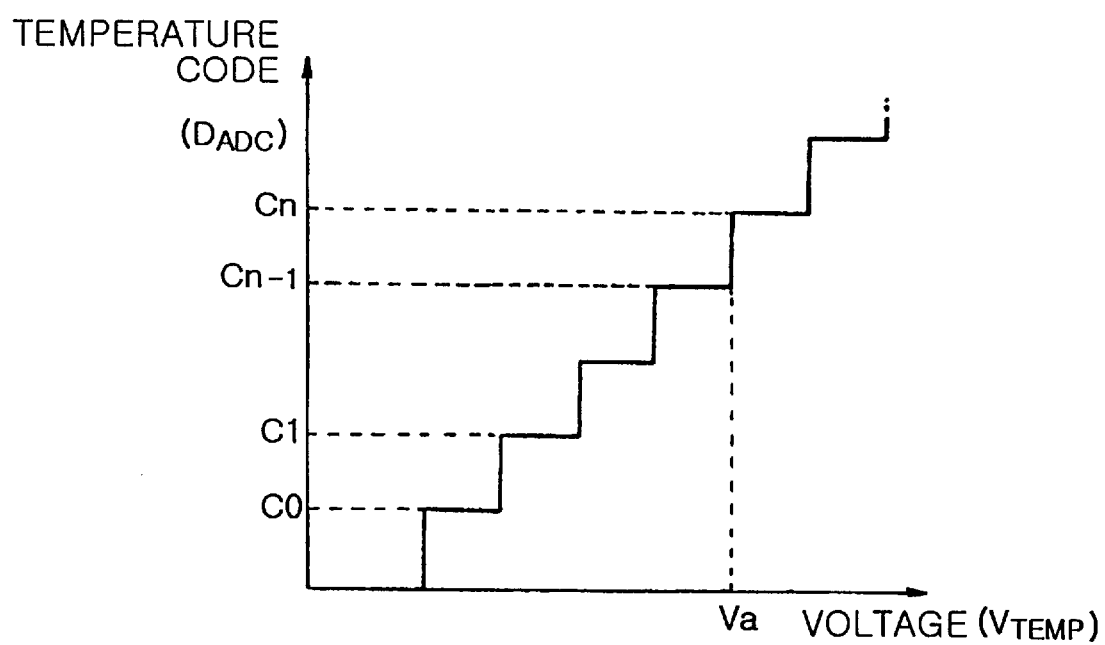

In order to prevent the vibrations of the output frequency, the frequency stabilizing method in the digital temperature compensating oscillator according to the present invention includes the steps of: a) an initial operating step of just after a supply of a power; b) a normal operating step in which sampled temperature data are checked after the initial operating step, to obtain a temperature code so as to eliminate transitory variations due to noises; and c) an abnormality coping step of immediately carrying out a temperature compensation at an abnormal situation.

Now the present invention will be described for each of the steps.

a) Initial Operating Step

At the step in which a power is supplied initially to the digital temperature compensating oscillator to start the operation, there is no previously detected temperature value to be compared with the present temperature value. Further, the memory (EPROM) does not store any temperature code. Accordingly, it is preceded in time that the digital temperature compensating oscillator outputs an output frequency than that the sampled temperature values are averaged to obtain a compensating capacitor data.

Accordingly, at the initial stage when the power is first supplied to activate the digital temperature compensating oscillator, the temperature data (as it is) of the analog/digital converter is supplied to the memory EPROM as the temperature code, so that an output frequency can be directly obtained.

Thus after obtaining the initial code value, the frequency stabilizing method according to the present invention is applied.

b) Normal Operation

After the above described initial operation, in a state with the frequency outputted from the digital temperature compensating oscillator DTCXO, a temperature code is obtained by averaging a certain number of temperature data, e.g., 16 temperature data which are outputted from the analog/digital converter. The temperature code is supplied to the memory.

Under the usual environment, the temperature rarely varies within a short period of time. Therefore, in order to eliminate the transitory variations originated from the noises, in the case where a certain number of temperature data are averaged, the output value of the analog/digital converter is compared with the preceding average value. Then the temperature data are taken as long as the difference between the two values does not depart from a predetermined range.

For example, the range of the temperature data which are currently being outputted from the analog/digital converter is limited to between −7 and 8, and then, the currently outputted temperature data is compared with the preceding temperature code. Then the difference between the two values which falls within the mentioned range (−7 and 8) is repeatedly taken for 16 times, and the taken values are averaged.

In this case, the analog noises which occur intermittently in the temperature sensor and in the analog/digital converter can be eliminated. Further, by averaging the certain number of data, e.g., 16 samples to use the averaged value as the temperature code, the errors of the temperature sensor and the analog/digital converter can be reduced from ±2 LSB to less than ±1 LSB. Further, the error occurrence ratio is also drastically reduced, and therefore, the vibrations of the output frequency are almost eliminated.

Under this condition, the temperature sampling is carried out 16 times to obtain the capacitor data from the memory. Therefore, it seems that much time is consumed compared with the one time execution of the conventional method. However, as described above, it rarely occurs that the ambient temperature is varied steeply. Therefore, the sampling operation can be carried out very fast compared with the variation of the ambient temperature.

A digital temperature compensating oscillator having a 19.68 MHz quartz oscillator will be taken as an example. In this digital temperature compensating oscillator, the periodical time for the temperature sampling is about 53 m sec ($=2^{20} \times 19.68$ MHz). Therefore, 16 temperature data are averaged at every 0.85 seconds ($=0.053 \times 16$ second).

Meanwhile, this digital temperature compensating oscillator was put to an experiment within a temperature chamber in which the temperature could be artificially steeply varied. In this chamber, if about one minute is consumed in raising or lowering 10°, then the temperature is varied by 0.14 ($=0.85 \div 10\%_0$)° C. during 0.85 seconds. The number of the temperature data which can be obtained through the temperature sensor and the analog/digital converter in a temperature interval from −30° C. to 80° C. is about 350–800. In other words, about 450 temperature codes can be obtained from a temperature variation interval of 110° C. Under this condition, if the temperature variation is 0.14° C., then the temperature data is varied by 1 LSB or less.

That is, during 0.85 seconds which is the maximum time required for supplying one temperature code to the memory, the temperature code will show almost no variation. Or even if it is varied, it shows to be as small as 1 LSB. Accordingly, in the present invention, the averaging of 16 temperature data does not give any problem. Further, even if a problem occurs, the error originating from it is very small compared with the conventional method.

Further, in averaging the temperature data as described above, even in the case where same codes occur consecutively, a couple of different codes may be sampled.

For example, if the preceding temperature code value is assumed to be 100, a temperature data 100 same as the preceding temperature data can be sampled 14 times, and some higher temperature data, e.g., 108 can be sampled twice.

However, as described above, the temperature cannot be steeply varied, and therefore, in this case, the temperature data 100 has more validity than the average value 101 ($=(100 \times 14 + 108 \times 2) \div 16$). That is, the two occurrence of 108 is likely to be errors due to various noises. Therefore, the average value 101 is likely to be an erroneous value. Further, in this case, at the next round of the sampling, the average is likely to be 100.

Accordingly, in order to detect such a transitory data variation, the output temperature data of the analog/digital converter is compared with the previously stored data. If same temperature codes occur in more than half of the samplings, that is, in the example of the present invention, if 8 or more same temperature codes occur, then the average value of the 16 samplings is not taken, but the previously stored temperature value is taken as it is.

c) Abnormality Coping Step

The preceding step b was proposed under the assumption that the temperature varies slowly, but there is the case where the temperature varies unexpectedly steeply.

For example, in the case where the temperature varies steeply due to the activation of, e.g., a room heating system at the step b, if the steep rise of the temperature is looked over as being caused by a noise, then the temperature compensation cannot be realized.

That is, according to the method of the step b, only the codes in which the difference belongs to a certain range (e.g., −7 to 8) are subjected to the arithmetic operation. Therefore, if the temperature codes departing from the mentioned range are sampled repeatedly, then the frequency compensation for the temperature cannot be realized.

Therefore, at this step, if the temperature data which are outputted from the analog/digital converter departs from the mentioned range by more than a certain number of times (e.g., 3 times), then the averaging is not done, but immediately the currently obtained temperature data is used as the temperature code for compensating the temperature.

Now the preferred embodiment of the present invention will be described referring to the attached drawings.

Figure 3:
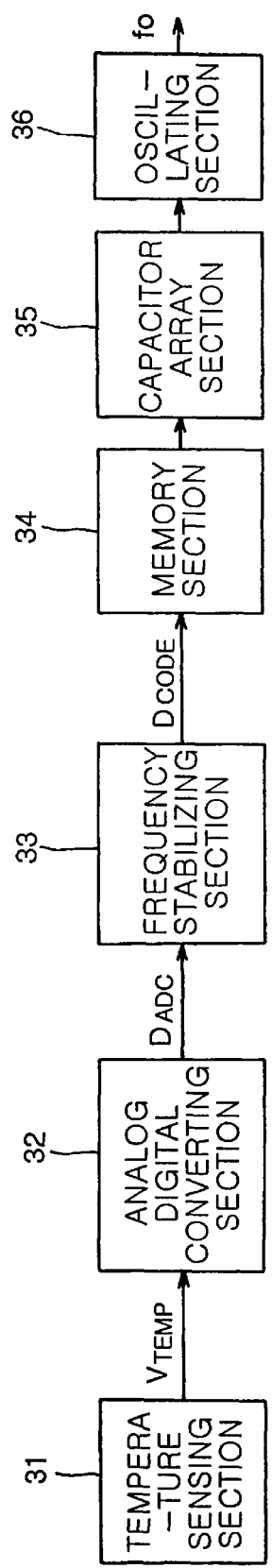
FIG. 3 is a block diagram showing the constitution of the digital temperature compensating oscillator according to the present invention.

FIG. 3 is a block diagram showing the constitution of the digital temperature compensating oscillator according to the present invention.

As shown in this drawing, the digital temperature compensating oscillator according to the present invention includes: a temperature sensing section 31 for sensing the ambient temperature to output it in a form of voltage signals; an analog/digital converting section 32 for converting the voltage signals $V_{temp}$ of the temperature sensing section 31 to digital data $D_{ADC}$ of a predetermined bit number; a frequency stabilizing section 33 for comparing the digital data $D_{ADC}$ of the analog/digital converting section 32 with a temperature code $D_{CODE}$ of a memory section 34, to output an average value of a number of the digital data $D_{ADC}$ (if their differences come within a predetermined range) as the temperature code $D_{CODE}$, and to output the present digital data $D_{ADC}$ as the temperature code if the digital data departs from the predetermined range by 3 or more times; the memory section 34 storing control data for generating compensation capacitances for different temperatures by using a relevant temperature data as an address, and outputting oscillation compensating data upon receipt of the temperature code $D_{CODE}$ from the frequency stabilizing section 33 by using the temperature code as an address; a capacitor array section 35 consisting of a plurality of capacitors interconnected through switching devices, the respective switching devices being activated by the control data of the memory section 34 to form respective capacitances; and an oscillating section 36 for being oscillated in accordance with inductances of a crystal oscillator and capacitances of the capacitor array section 35, to output a frequency fo.

Figure 4:
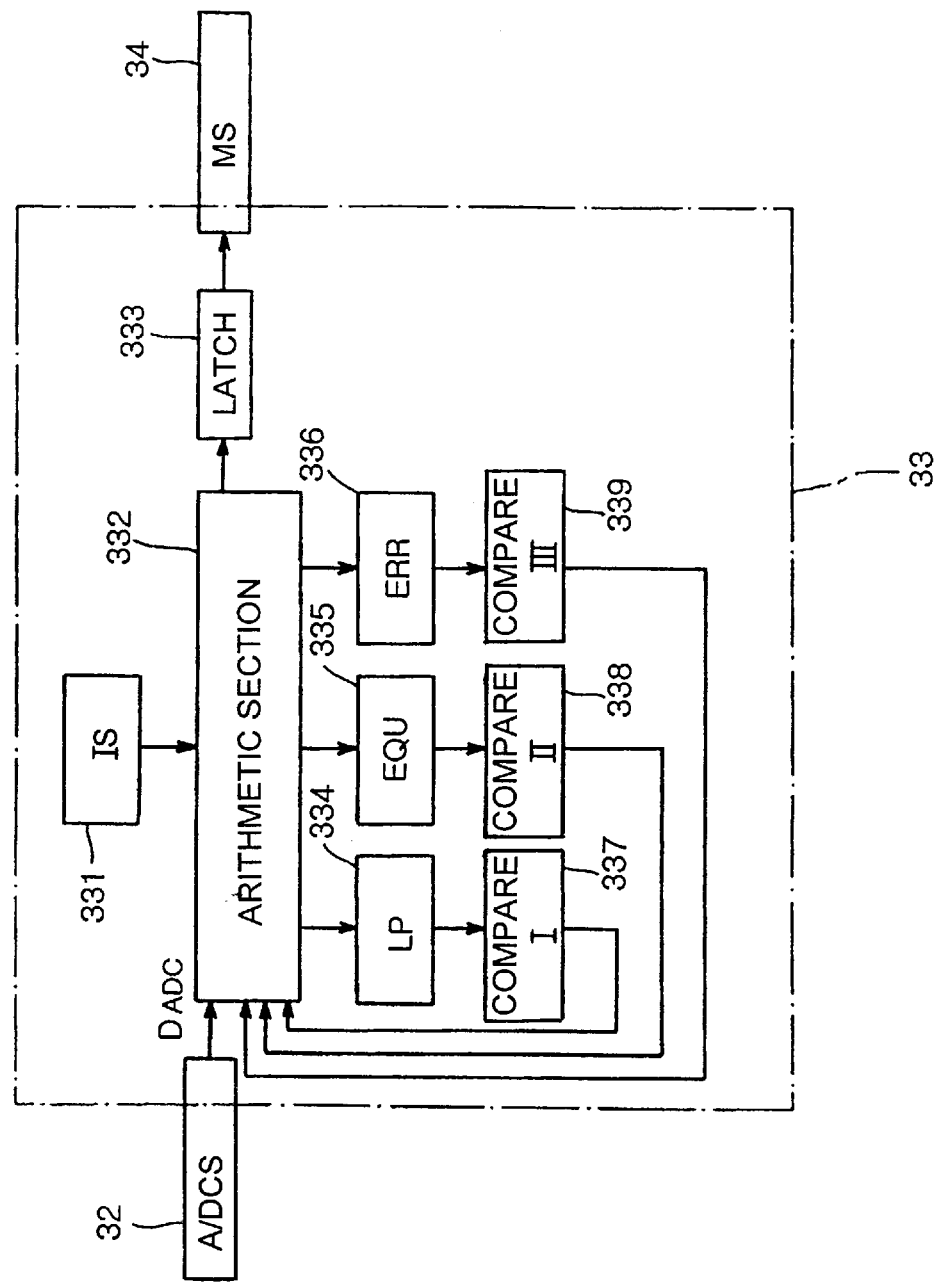
FIG. 4 is a block diagram showing the constitution of the frequency stabilizing section of the digital temperature compensating oscillator according to the present invention.

FIG. 4 is a block diagram showing the constitution of the frequency stabilizing section of the digital temperature compensating oscillator according to the present invention.

As shown in this drawing, the frequency stabilizing section 33 includes: an initializing section 331 for initializing respective variables to an initial value (0) at each output of the temperature code $D_{CODE}$; an arithmetic section 332 for judging as to whether the digital data of the analog/digital converting section 32 come within a predetermined range of the temperature code $D_{CODE}$ of the memory section 34, for accumulating if it comes within the predetermined range, for outputting a temperature code by averaging the accumulated values it the accumulations are repeated more than certain times, for outputting the present digital data as the temperature code $D_{CODE}$ if the digital data departs from the predetermined range more than certain number of times, and for outputting a preceding temperature code if the digital data same as the preceding temperature code occurs more than a predetermined number of times; a latch 333 for storing the temperature code of the arithmetic section 332; a first counting section 334 for counting the number of times of the accumulations of the digital data; a second counting section 335 for counting the number of times of the occurrences of the digital data same as the preceding temperature code; a third counting section 336 for counting the number of times of the occurrences of the digital data departing from the predetermined range; a first comparing section 337 for carrying out a notification to the arithmetic section 332 when the counted value LP of the first counting section 334 reaches a predetermined number of accumulations; a second comparing section 338 for carrying out a notification to the arithmetic section 332 when the counted value EQU of the second counting section 335 reaches a predetermined occurrence times; and a third comparing section 339 for carrying out a notification to the arithmetic section 332 when the counted value ERR of the third counting section 336 reaches a predetermined number of error occurrences.

Figure 5:
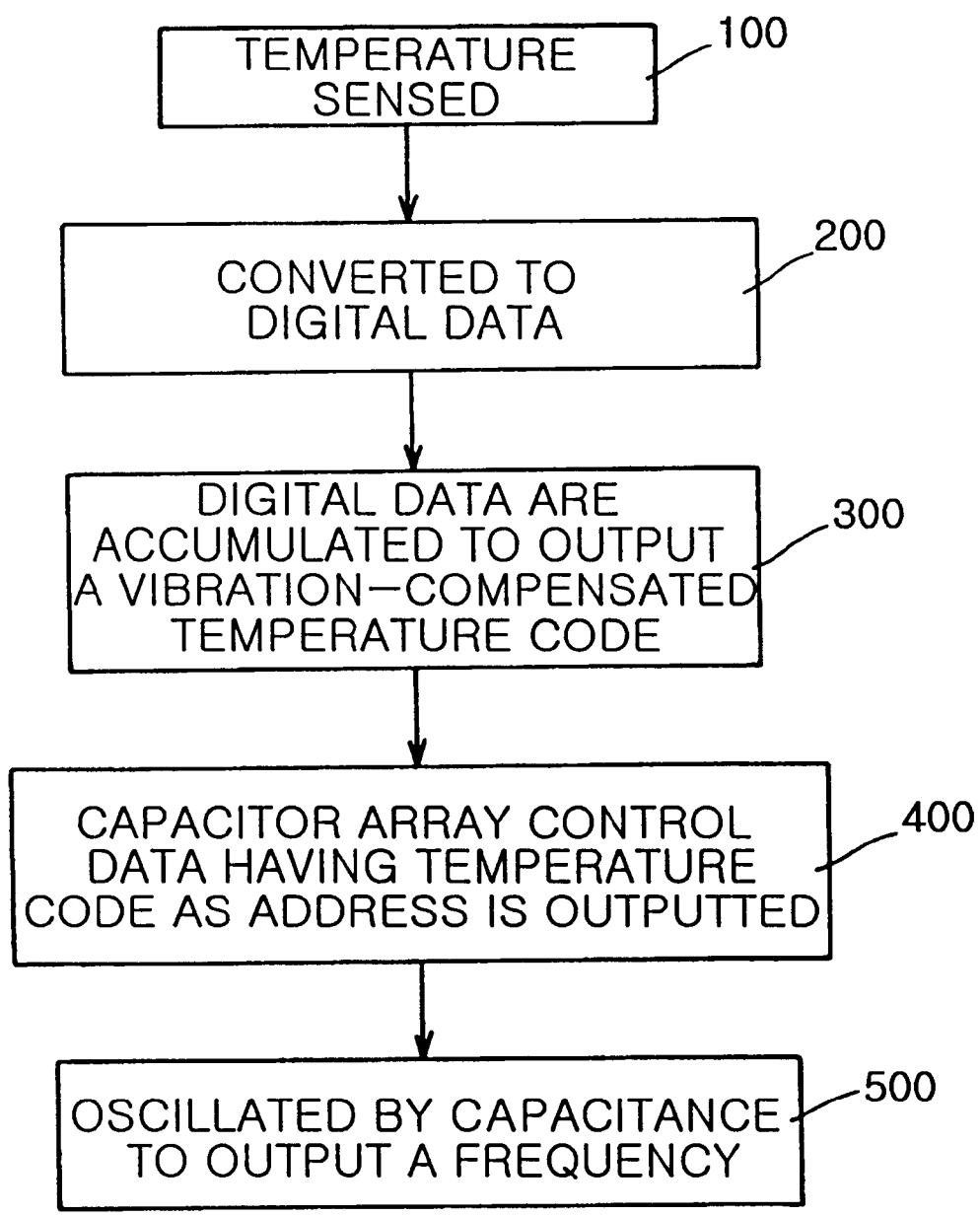
FIG. 5 is a flow chart showing the overall operation sequence of the digital temperature compensating oscillator according to the present invention.
Figure 6:
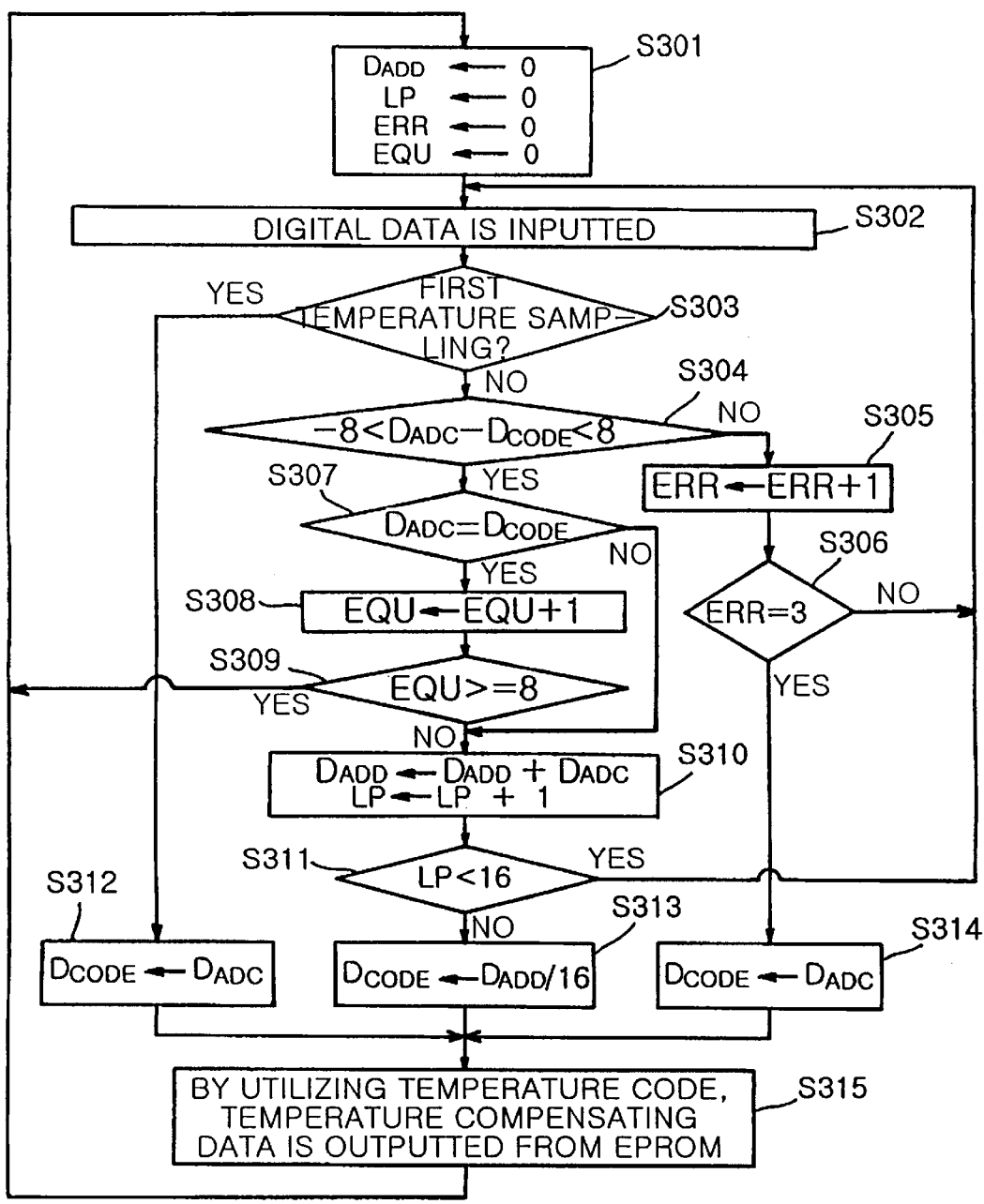
FIG. 6 is a flow chart showing the operation sequence of the frequency stabilizing section of the digital temperature compensating oscillator according to the present invention.

FIG. 5 is a flow chart showing the overall operation sequence of the digital temperature compensating oscillator according to the present invention. FIG. 6 is a flow chart showing the operation sequence of the frequency stabilizing section of the digital temperature compensating oscillator according to the present invention.

In the digital temperature compensating oscillator of FIG. 3, the power is always supplied to the frequency stabilizing section 33, the memory section 34, the capacitor array section 35 and the oscillating section 36, and therefore, the frequency fo is always being outputted. Meanwhile, the temperature sensing section 31 and the analog/digital converting section 32 operate intermittently at a predetermined period, e.g., at every scores of msec so as to output temperature voltages $V_{temp}$ and digital data $D_{ADC}$.

FIG. 5 is a flow chart showing the overall operation sequence of the digital temperature compensating oscillator according to the present invention. First, the device temperature is sensed by the temperature sensing section 31 so as to output analogs signals, i.e., temperature voltages $V_{temp}$ (100). The analog/digital converting section 32 which has received the temperature voltages outputs a digital data which corresponds to the temperature voltage $V_{temp}$ (200).

The digital data $D_{ADC}$ is inputted into the frequency stabilizing section 33 to be processed as shown in the flow chart of FIG. 6.

That is, if the power is supplied, all the variables within the frequency stabilizing section 33 are initialized to "0". That is, the variable $D_{ADC}$ which is formed by accumulating the digital data coming within the predetermined range, the loop counting variable LP which is obtained by counting the accumulation times of the digital data $D_{ADC}$, the error counting variable ERR which is obtained by storing the digital data departing from the predetermined range, and the equal value counting variable EQU which is obtained by storing the number of the digital data $D_{ADC}$ same as the preceding temperature code $D_{CODE}$, are all initialized to "0". (S301).

Under this condition, if the digital data $D_{ADC}$ is inputted from the analog/digital converting section 32, then a checking is made as to whether the digital data is the first temperature sampling value (S303).

This can be confirmed by checking the latch 333 which is the means for storing the temperature code $D_{CODE}$. That is, if there is no value stored in the latch 333, it is the first temperature sampling, while if there is a value stored there, then it is not a first temperature sampling.

Upon carrying out the above checking, if it is found that it is the first temperature sampling, then the digital data is outputted as a temperature code $D_{CODE}$ through the latch 333 to an address terminal of the memory section 34.

Then the memory section 34 outputs a correction control data to the capacitor array section 35, the correction control data having the inputted temperature code $D_{CODE}$ as the address. Then the capacitor array section 35 generates a frequency deviation correcting capacitance corresponding to the present temperature. Then through the generated capacitance, the oscillating section 36 outputs the predetermined frequency fo.

After the above described initial step, the following procedure is carried out. That is, when the temperature sensing section 31 and the analog/digital converting section 32 operate periodically at predetermined intervals, and receive the digital data corresponding to the ambient temperature, the digital data is not the first temperature sampling data. Therefore, arithmetic section 332 checks as to whether the difference between the presently inputted digital data and the temperature code comes within a predetermined range. The predetermined range is the range of the variable temperatures, and in the present invention, this range is assumed to be −8 to 8.

If the mentioned difference does not come within the predetermined range, then it is recognized as an error value, and therefore, a signal is sent to the third counting section 336, so that the error counting variable ERR would be incremented by 1 (S305).

On the other hand, if the mentioned difference comes within the predetermined range, then a judgment is made as to whether the inputted digital data $D_{ADC}$ is same as the temperature code $D_{CODE}$ (S307). Under this condition, if the inputted digital data is same as the temperature code, then a signal is sent to the second counting section 2, so that the equal value counting variable EQU would be incremented by 1 (S308).

However, if the inputted digital data is not same as the temperature code, but if it comes within the predetermined range, then the inputted digital data is added to the accumulated variable $D_{ADC}$, and a signal is sent to the first counting section 334, so that the loop counting variable LP can be incremented by 1 (S310).

The above described digital data processing procedure is repeated until a data same as the previously set-up temperature code occurs a predetermined number of times, e.g., 8 times, or until the accumulation times of the digital data exceeds a predetermined number of times, e.g., more than 16 times, or until the digital data departing from the predetermined range occurs a predetermined number of times, e.g., more than 3 times (S311).

That is, a judgment is made by the first comparing section 337 as to whether the counted value of the first counting section 334 is more than a predetermined number of times (16 times). Then a judgment is made by the second comparing section 338 as to whether the counted value of the second counting section 335 is more than a predetermined number of times (8 times). Then a judgment is made by the third comparing section 339 as to whether the counted value of the third counting section 336 is more than a predetermined number of times (3 times). Then a signal is sent to the arithmetic section 332.

Upon being informed by the first comparing section 337 that the accumulation of the digital data has exceeded the predetermined number of times, the arithmetic section 332 calculates an average by dividing the accumulated value by the number of the accumulations, and this average value is stored as the temperature code $D_{CODE}$ (S313).

Meanwhile, upon being informed by the second comparing section 338 that the digital data same as the preceding temperature code has occurred more than the predetermined number of times (more than 8 times), the arithmetic section 332 maintains the preceding temperature code $D_{CODE}$ intact (S312).

Meanwhile, upon being informed that the digital data departing from the predetermined range has occurred more than the predetermined number of times (more than 3 times), the arithmetic section 332 stores the presently inputted digital data as the temperature code $D_{CODE}$ (S314).

The temperature code $D_{CODE}$ which has been decided in the above described manner is supplied to the memory section 34. Then the memory section 34 outputs a temperature compensating data $D_{EPROM}$ to the capacitor array section 35, the temperature compensating data $D_{EPROM}$ having the inputted temperature code as the address. As described above, a capacitance correction is realized in accordance with the variation of the ambient temperature, and therefore, the oscillating section 36 can maintain the oscillated frequency fo at a constant level.

Figure 7A:
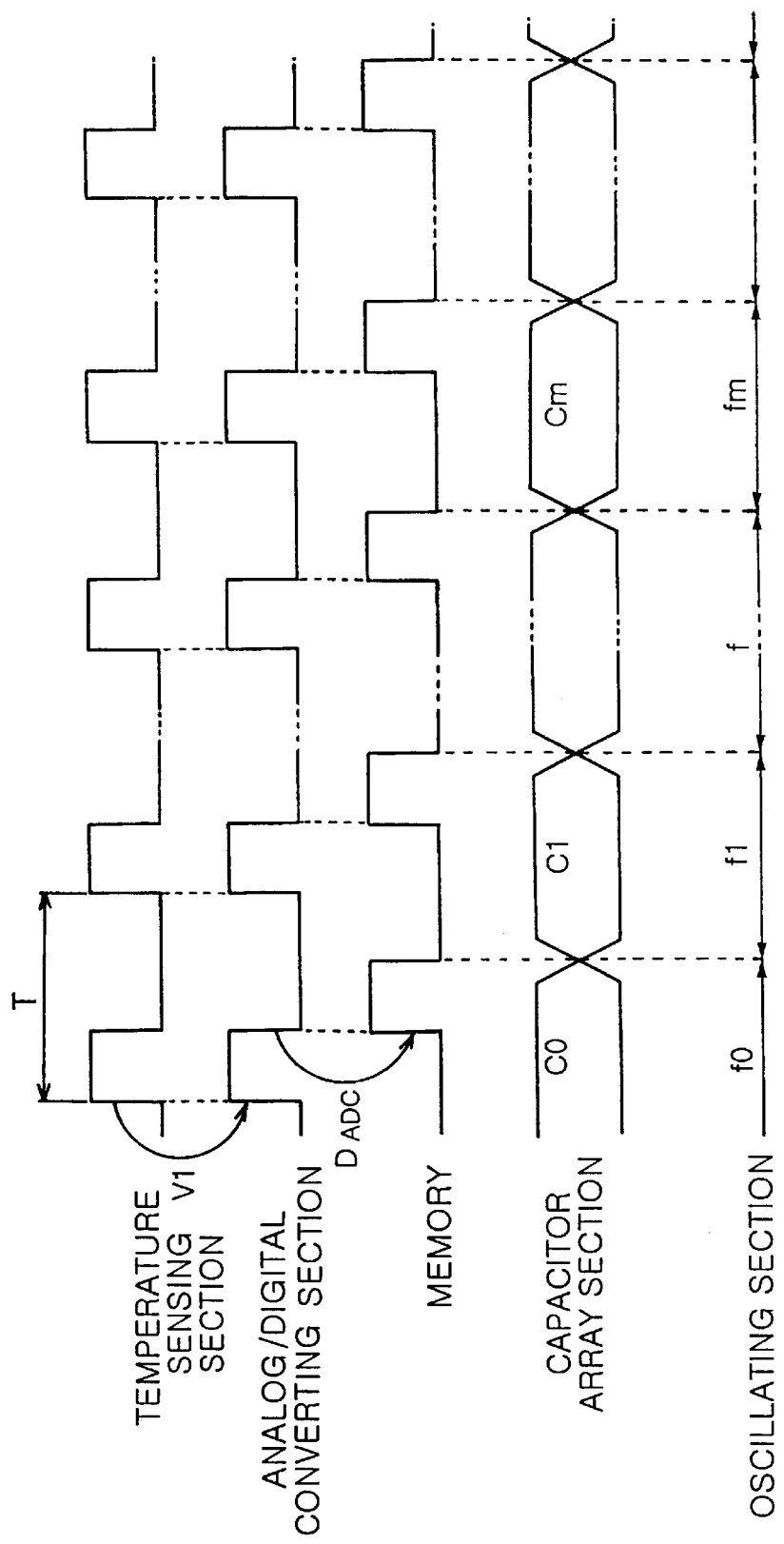
FIG. 7a is a timing chart showing the operation starting points of the respective component devices of the conventional digital temperature compensating oscillator.
Figure 7B:
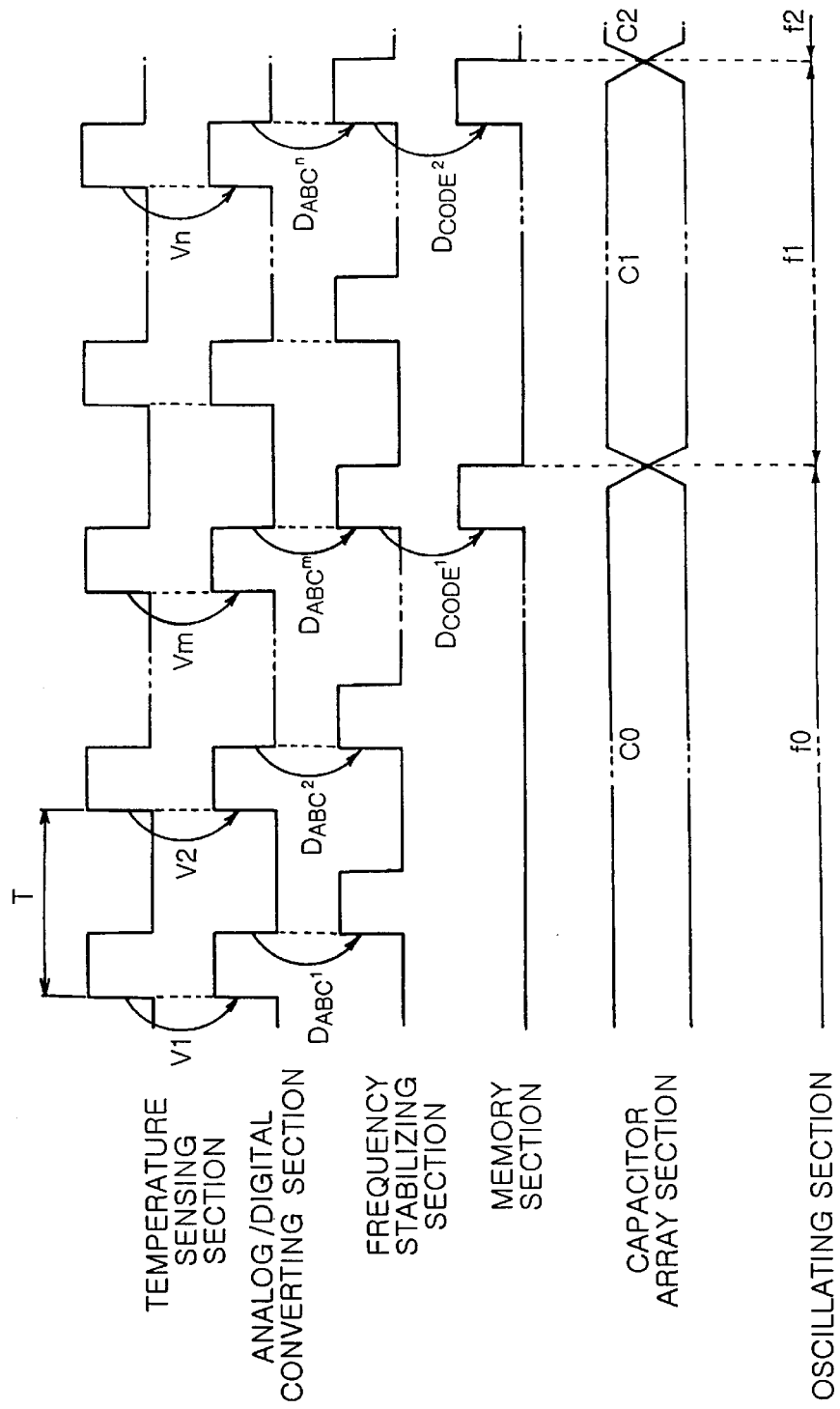
FIG. 7b is a timing chart showing the operation starting points of the respective component devices of the digital temperature compensating oscillator according to the present invention.
Figure 8A:
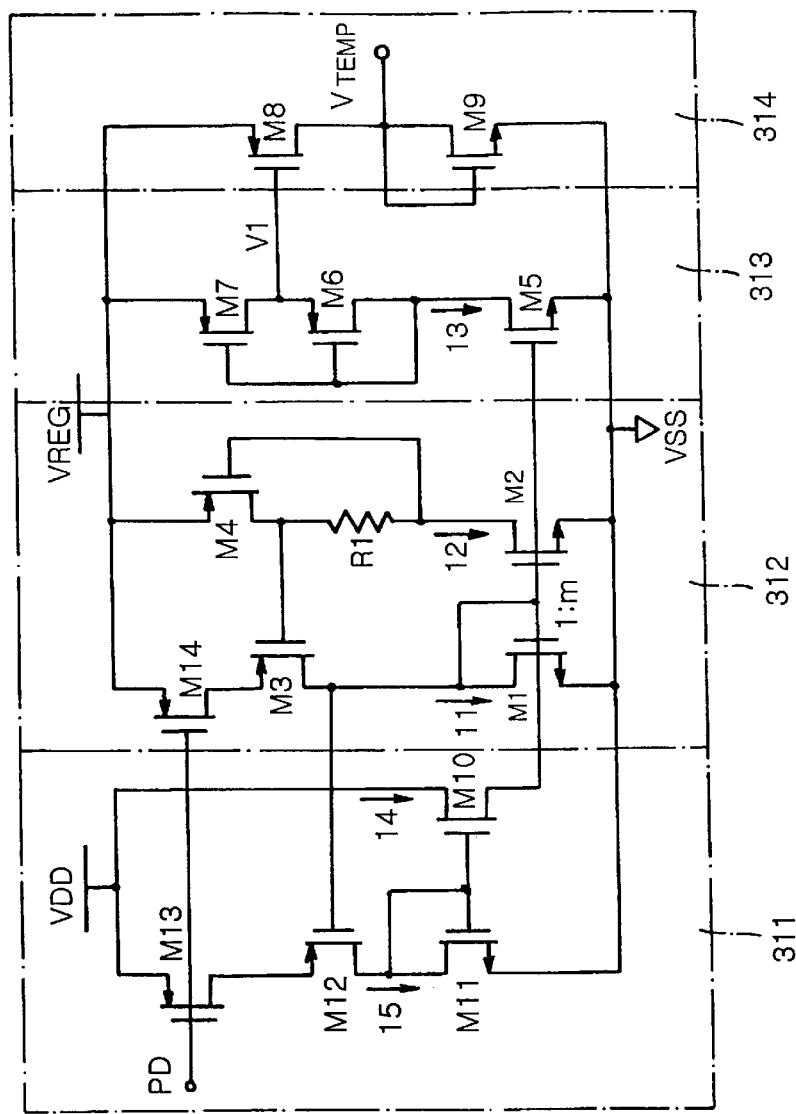
FIG. 8a is a circuit diagram showing the constitution of the temperature sensing section.
Figure 8B:
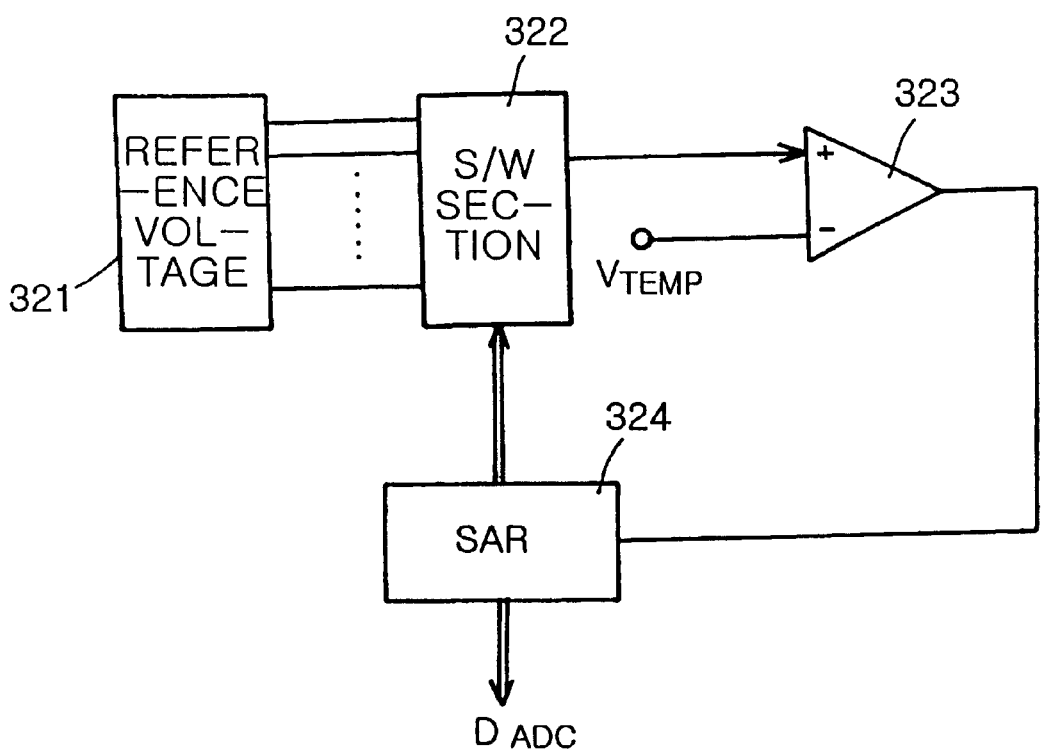
FIG. 8b illustrates the constitution of the analog/digital converting section.
Figure 8C:
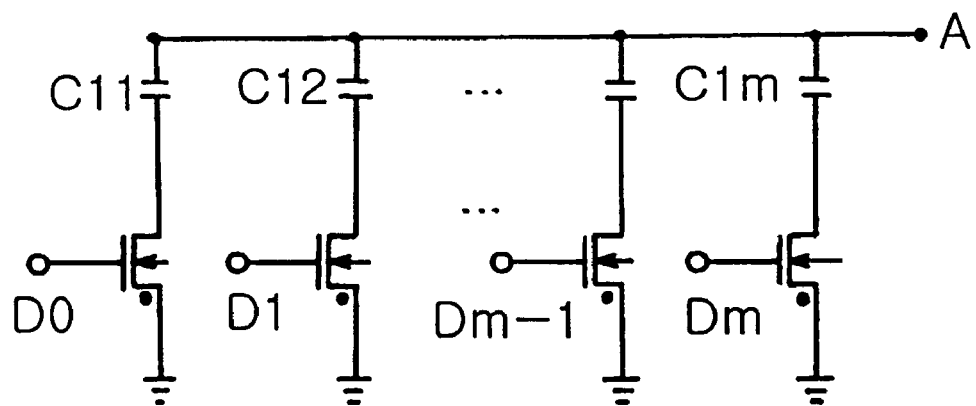
FIG. 8c is a circuit diagram showing the constitution of the capacitor array.
Figure 8D:
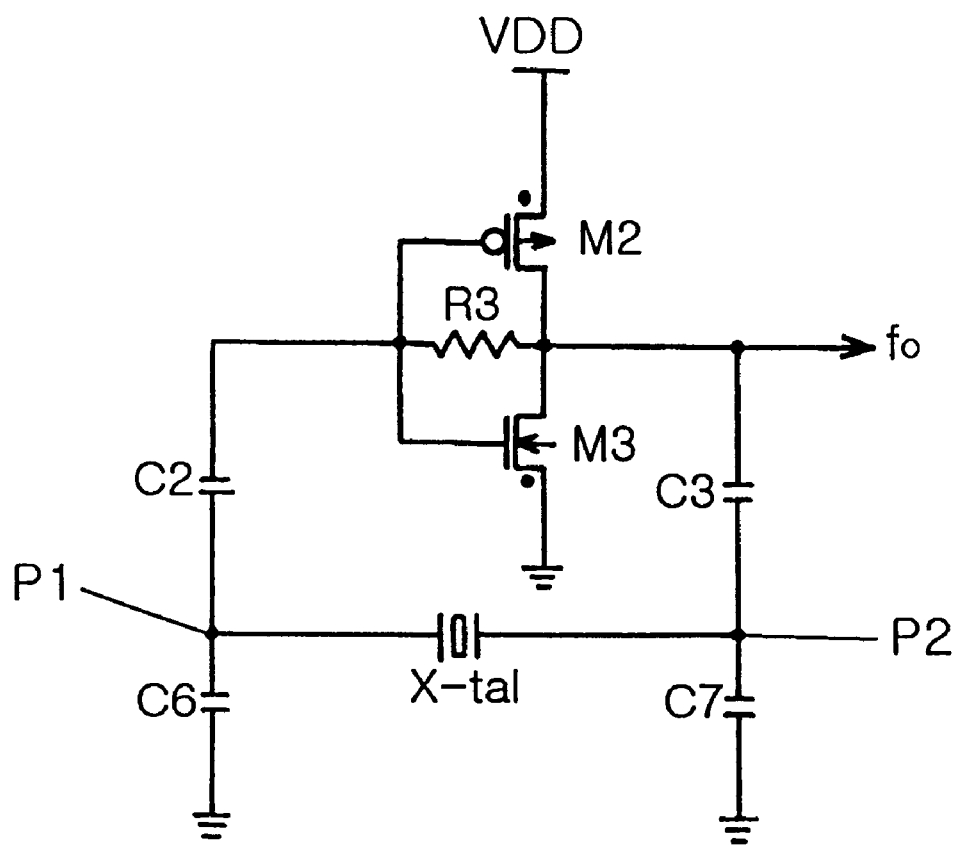
FIG. 8d is a circuit diagram showing the constitution of the oscillating section.

As shown in FIG. 7b, in the digital temperature compensating oscillator according to the present invention, if the temperature sensing section 31 outputs a temperature voltage Vn by being operated at each predetermined temperature sampling period T, then the analog/digital converting section 32 is operated together with the temperature sensing section 31 to output a digital data $D_{ADC}$ n as the temperature voltage Vn.

Further, the frequency stabilizing section 33 does not supply the digital data (as it is) to the memory section 34, but an average of the digital data $D_{ADC}n-D_{ADC}n+16$ of the 16 times is supplied to the memory section 34. Or if the digital data departing from the predetermined range occurs more than 3 times, then the temperature code is directly outputted to the memory section 34. Or if the digital data same as the preceding temperature code has occurred more than 8 times, then the digital data is outputted to the memory section 34. Thus the memory section 34 outputs the temperature compensating data at each of 3T~18T (where T is the temperature sampling period). Under this condition, the capacitances of the capacitor array section 35 are varied. Accordingly, the variations of the oscillated frequency due to the transitory noises can be prevented. Further, even in the case where a steep temperature variation has occurred, the frequency can also be corrected. Further, the vibrations of the oscillated frequency at the boundary regions during the digital conversion can be eliminated.

FIG. 7a is a timing chart showing the operation starting point of the respective component devices of the conventional digital temperature compensating oscillator. It is seen that the capacitances of the capacitor array section and the oscillation frequency are varied at each temperature sensing. In this case, the output frequency fo is varied or vibrated due to the noises which are contained in the temperature sensing signals.

According to the present invention as described above, the fact that the stability of the output frequency is important is considered. That is, the temperature code is decided by averaging an accumulated sampling data, thereby decreasing the signal vibrations at the same temperature. If there are more then half of the digital data same as the present temperature code, then a re-setting is not made, but the preceding temperature code is maintained as it is. Thus the signal variation component due to the noise is eliminated. If the digital data departing from the predetermined range occurs more than the predetermined number of times, the averaging is not carried out, but the present output data is adopted as the temperature code. Therefore, even if a steep variation occurs in the temperature, a proper temperature compensation can be carried out.

What is claimed is:

1. A frequency stabilizing method in a digital temperature compensating oscillator including an analog/digital converting means, a memory means and an oscillating means, comprising the steps of:

checking as to whether a temperature data of said analog/digital converting means is a first sampling data, to adopt the temperature data of said analog/digital converting means as a temperature code so as to obtain a temperature compensating data if it is the first sampling data; and accumulating the temperature data of said analog/digital converting means up to a predetermined sampling number of times, and supplying an average of the temperature data thus accumulated to said memory means so as to obtain a temperature code for a temperature compensation, if it is not the first sampling data.

2. The frequency stabilizing method as claimed in claim 1, wherein when accumulating the temperature data of said analog/digital converting means, the temperature data coming within a predetermined range is accumulated, and the temperature data thus accumulated are averaged to obtain an average value.

3. The frequency stabilizing method as claimed in claim 1, wherein when accumulating the temperature data of said analog/digital converting means, a checking is carried out as to whether the temperature data is same as a preceding temperature code, and if the temperature data same as the temperature code occurs more than a predetermined number of times, then the preceding temperature code is inputted into said memory means.

4. The frequency stabilizing method as claimed in claim 1, wherein a checking is carried out as to whether the temperature thus obtained comes within a predetermined range, to exclude the temperature data departing from the predetermined range;

then a checking is carried out as to whether a difference between the present temperature code and the temperature data departs from a predetermined range, and checking is carried out as to the number of occurrences of the difference departing from the predetermined range; and if the number of the occurrences exceeds a predetermined number, then a present temperature data of said analog/digital converting means is supplied to said memory means as the temperature code.

5. A frequency stabilizing method in a digital temperature compensating oscillator, comprising the steps of:

initializing variables such as a temperature data accumulation arithmetic variable, a loop counting variable, an error counting variable, and a variable for counting occurrence times of a temperature data same as a temperature code;

obtaining a temperature data by using a temperature sensing means and an analog/digital converting means;

checking as to whether the temperature data thus obtained is a first temperature data;

checking as to whether the temperature data thus obtained comes within a predetermined range, if it is not the first temperature data;

accumulating the temperature data, incrementing a loop counter by 1, and repeating from the step of obtaining the temperature data until said loop counter shows a predetermined value, if the temperature data thus obtained comes within the predetermined range;

incrementing an error counter by 1, and repeating from the step of obtaining the temperature data, if the temperature data thus obtained departs from the predetermined range;

adopting the present temperature data as the temperature code if the temperature data is the first temperature data or if said error counter shows a value more than a predetermined value;

adopting an average value as the temperature code by dividing an accumulation variable by a number of accumulations if a loop counter value is more than a predetermined value; and carrying out a temperature compensation with the temperature code thus adopted, and then, repeating from the variable initializing step until oscillations are terminated.

6. The frequency stabilizing method as claimed in claim 5, wherein a checking is carried out as to how many temperature data same as a present temperature code among the accumulated temperature data has occurred, and the temperature code is maintained intact if the occurrence is more than a predetermined value.

7. The frequency stabilizing method as claimed in claim 6, wherein a new temperature code is set up if more than half of the accumulations of the temperature data are same temperature data.

8. A digital temperature compensating oscillator comprising:

a temperature sensing means for sensing an ambient temperature; and an analog/digital converting means for converting sensed values into digital signals, so as to correct frequency variations in accordance with variations of the ambient temperature, the digital temperature compensating oscillator further comprising:

a frequency stabilizing section for checking as to whether a digital data representing the ambient temperature comes within a predetermined temperature range, for accumulating the digital data coming within the predetermined temperature range by a predetermined number of times; and for outputting an average value of the digital data thus accumulated or the digital data departing from the predetermined temperature range as a temperature code.

9. The digital temperature compensating oscillator as claimed in claim 8, wherein said frequency stabilizing section comprises:

an initializing section for initializing respective variables to an initial value (0) at each output of the temperature code;

an arithmetic section for judging as to whether the digital data of said analog/digital converting means come within a predetermined range of the temperature code for accumulating if it comes within the predetermined range, for outputting a temperature code by averaging the accumulated values if the accumulations are repeated more than a certain number of times;

a latch for storing the temperature code of said arithmetic section;

a first counting section for counting the number of times of the accumulations of the digital data; and a first comparing section for carrying out a notification to said arithmetic section when a counted value LP of said first counting section reaches a predetermined number of accumulation times, whereby if the digital data coming within a normal temperature variation range are accumulated by a predetermined number of times, then they are averaged to output it as a temperature code.

10. The digital temperature compensating oscillator as claimed in claim 9, wherein said frequency stabilizing section comprises:

a second counting section for counting the number of times of occurrences of the digital data same as the preceding temperature code; and a second comparing section for carrying out a notification to said arithmetic section when a counted value EQU of said second counting section reaches a predetermined number of occurrence times;

whereby if the digital data occur as many times as a predetermined number of times, then a preceding temperature code is directly outputted to a memory section.

11. The digital temperature compensating oscillator as claimed in claim 9, wherein said frequency stabilizing section comprises:

a third counting section for counting the number of times of occurrences of the digital data departing from the predetermined range;

a third comparing section for carrying out a notification to said arithmetic section when a counted value ERR of said third counting section reaches a predetermined number of error occurrences;

whereby if the digital data departing from the predetermined temperature range occur as many times as a predetermined number of times, then an inputted digital data is directly outputted as the temperature code.

* * * * *